(12) United States Patent
Muranushi et al.

(10) Patent No.: US 7,681,107 B2
(45) Date of Patent: Mar. 16, 2010

(54) SEMICONDUCTOR DEVICE

(75) Inventors: Makoto Muranushi, Kawasaki (JP);
Masami Kanasugi, Kawasaki (JP);
Shoji Taniguchi, Kawasaki (JP); Koichi Kuroiwa, Kawasaki (JP); Norihiro Ikeda, Kawasaki (JP)

(73) Assignee: Fujitsu Microelectronics Limited, Yokohama (JP)

(*) Notice: Subject to any disclaimer, the term of this patent is extended or adjusted under 35 U.S.C. 154(b) by 1314 days.

(21) Appl. No.: 11/045,066

(22) Filed: Jan. 31, 2005

(65) Prior Publication Data
US 2006/0095829 A1    May 4, 2006

(30) Foreign Application Priority Data
Oct. 28, 2004    (JP)    ............................ 2004-314555

(51) Int. Cl.
*G11C 29/00*    (2006.01)
(52) U.S. Cl. .................. 714/766; 714/763; 714/773
(58) Field of Classification Search ............... 714/766, 714/763, 768, 758, 15, 773, 703, 52, 764, 714/800
See application file for complete search history.

(56) References Cited

U.S. PATENT DOCUMENTS

| | | | | |
|---|---|---|---|---|
| 4,901,320 A | * | 2/1990 | Sawada et al. | 714/15 |
| 5,392,301 A | * | 2/1995 | Fukushima | 714/766 |
| 5,958,079 A | * | 9/1999 | Yoshimura | 714/766 |
| 6,073,267 A | * | 6/2000 | Sasaki | 714/799 |
| 6,584,210 B1 | * | 6/2003 | Taguchi et al. | 382/100 |
| 6,847,088 B2 | * | 1/2005 | Yamada | 257/392 |
| 6,861,872 B2 | * | 3/2005 | Suh | 326/62 |
| 6,865,112 B2 | * | 3/2005 | Kawai et al. | 365/185.22 |
| 6,907,497 B2 | * | 6/2005 | Hosono et al. | 711/103 |
| 7,266,735 B2 | * | 9/2007 | Hirabayashi | 714/703 |

FOREIGN PATENT DOCUMENTS

JP    03144838 A    6/1991

* cited by examiner

*Primary Examiner*—Scott T Baderman
*Assistant Examiner*—Fritz Alphonse
(74) *Attorney, Agent, or Firm*—Arent Fox LLP

(57) ABSTRACT

A semiconductor having an internal memory of the present invention comprises a first memory copying and holding a data held in a storage device; a second memory holding a check code of the data held in the first memory, and being constantly supplied with a source voltage not lower than a data-holding-guarantee voltage; a data check unit detecting error in the data held by the first memory based on the check code; and reloading units copying only the data corresponded to the block having a data error detected therein by the data check unit, from the storage device to the first memory, to make it possible to detect any error in the data held in the first memory to thereby guarantee the data, and to lower the source voltage to be supplied to the first memory.

25 Claims, 11 Drawing Sheets

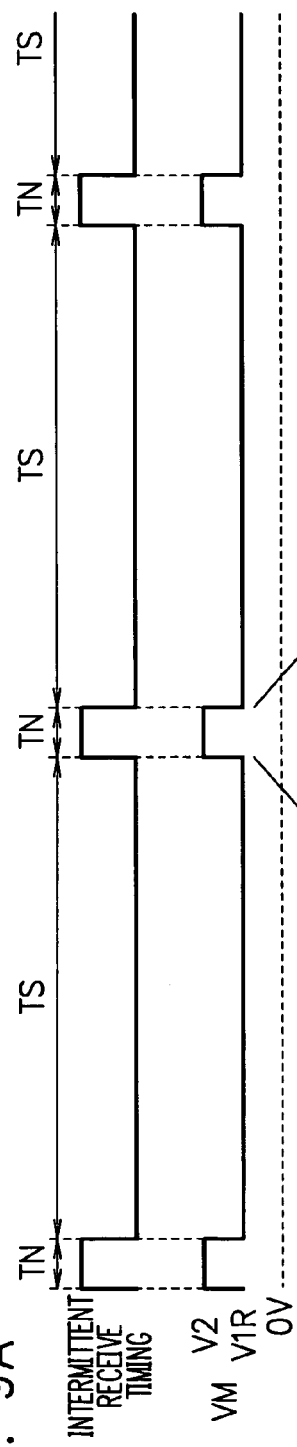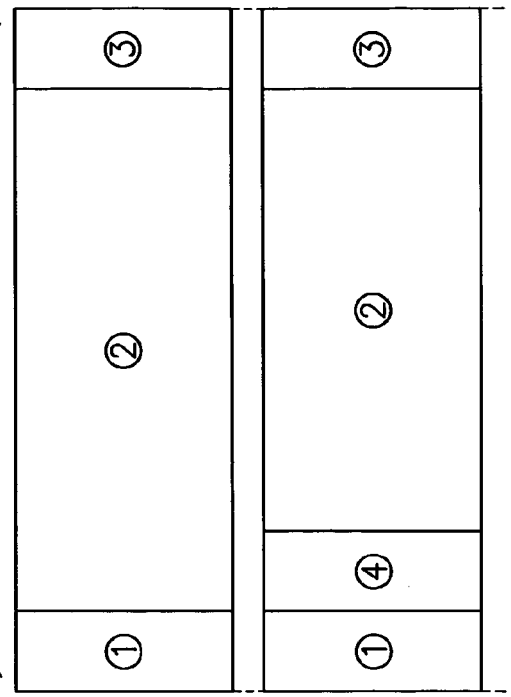

SEMICONDUCTOR DEVICE

CROSS-REFERENCE TO RELATED APPLICATIONS

This application is based upon and claims the benefit of priority from the prior Japanese Patent Application No. 2004-314555, filed on Oct. 28, 2004, the entire contents of which are incorporated herein by reference.

BACKGROUND OF THE INVENTION

1. [Field of the Invention]

The present invention relates to a semiconductor device and in particular to a semiconductor device having an internal memory capable of performing power-save operation with a power consumption smaller than that in the normal operation.

2. [Description of the Related Art]

Power consumption is one of most essential electric characteristics of mobile instruments such as mobile phones and PDAs (personal digital assistants) powered by batteries. No problem may arise if power supply to all circuits within a mobile instrument can be interrupted, but a part of the circuits cannot be disconnected from the power supply, because the mobile phones, for example, must establish broadcast control channel at predetermined intervals of time. Also for the PDAs, a satisfactory level of response speed is required when they return from the power-save operation back to the normal operation.

For example, microcomputers of some mobile instruments, having a processor (CPU) and a volatile internal memory as a work memory therefor, hold programs for the processor, table data for hardware setting and so forth in the internal memory during the operation thereof. The programs, table data and so forth are copied from a non-volatile external memory into the internal memory, by a boot operation after the power-ON.

Interruption of the power supply to the internal memory therefore needs a reboot operation for the operation for the next time, so as to copy the programs for the processor and the table data for hardware setting again from the external memory into the internal memory. The reboot operation, however, takes a considerably long time, and is not negligible in terms of a power consumption, because power consumption occurs also in the input/output (I/O) circuits or the like, due to access to the external memory. It is therefore necessary to constantly supply current to the internal memory so as to avoid the reboot operation.

Recent integrated circuits, typified by LSIs, are becoming more severely suffered from an increasing leakage current ascribable to gate leakage and channel leakage, with advancement in micronization of the process, so that even the constant power supply only simply to the circuits results in a large power consumption due to the leakage current. More specifically, recent power consumption ascribable to the leakage current amounts as large as 10% or around of the power consumption during the operation, which is a non-ignorable level.

Some efforts have been made on reduction in the leakage current, in which the above-described internal memory is supplied only with a reduced source voltage during the period other than the normal operation. However, the reduction in the source voltage to a level not higher than the data-holding-guarantee voltage (also referred to as data-holding source voltage, or power-down source voltage), which is prescribed in the specification of the internal memory as a voltage reliably assuring the held data, cannot guarantee the data held in the internal memory, and this limits an allowable range for the lowering in the source voltage.

FIG. 10 is a block diagram showing an exemplary configuration of a conventional microcomputer system owned by a mobile instrument. A microcomputer 51 has a processor (CPU) 53, a loader 54, and an internal memory 55.

The processor 53 takes part in executing calculation and control of various functional units in the microcomputer 51. The loader 54 reads a data held by the external memory 52 provided outside the microcomputer 51, and writes (copies) it into the internal memory 55, following instructions of the processor 53.

The external memory 52 is a non-volatile memory holding programs for the processor 53, table data and so forth. The internal memory 55 is a volatile memory functions as a work memory of the processor 53. The power source unit 56 supplies a source voltage VM to the internal memory 55.

Next paragraphs will describe operations of a mobile phone applied with the microcomputer system shown in FIG. 10, referring to FIG. 11. FIG. 11 shows an intermittent operation of the mobile phone, wherein TN denotes a normal operation period, and TS denotes a power-save operation period allowing operation at a power consumption lower than that in the normal operation.

The mobile phone having the microcomputer system shown in FIG. 10 operates following either of the process flow A and process flow B.

<Process Flow A>

Step A1: Upon power-ON, (or upon detection of any abnormality), the processor 53 reads a boot program stored in a ROM or the like, not shown, and executes it. The loader 54 herein reads a program for the processor 53, table data and so forth held in a fixed data area DOA of the external memory 52, and writes the readout data into a data area DIA of the internal memory 55, following instructions of the processor 53. In this way, the boot operations, such as copying of the program for the processor 53, table data and so forth from the external memory 52 to the internal memory 55, and various initial settings by the processor 53, are carried out. After completion of the boot operations, the processor 53 starts the operation based on the program held in the internal memory 55.

Step A2: Detection of base station, registration of location and incoming call detection are carried out, and wait operation is started if there is neither incoming call nor outgoing call (normal operation).

Step A3: The source voltage VM to be supplied to the internal memory 55 is reduced to voltage V1 at time $t_{11}$ (power-save operation started). The voltage V1 is a data-holding-guarantee voltage of the internal memory 55.

Step A4: The source voltage VM to be supplied to the internal memory 55 is raised to V2 at time $t_{12}$, after the elapse of period TS from time $t_{11}$ (power-save operation completed).

Steps A2 to A4 are repeated thereafter.

<Process Flow B>

Step B1: The boot operations similar to those in step A1 of process flow A are carried out.

Step B2: Detection of base station, registration of location and incoming call detection are carried out, and wait operation is started if there is neither incoming call nor outgoing call (normal operation).

Step B3: Necessary data out of those held in the internal memory 55 is saved in the external memory 52.

Step B4: The source voltage VM to be supplied to the internal memory 55 is set to 0 V at time $t_{11}$, or power supply to the internal memory 55 is interrupted (power-save operation started).

Step B5: The source voltage VM to be supplied to the internal memory 55 is raised to V2 at time $t_{12}$, after the elapse of period TS from time $t_{11}$ (power-save operation completed).

Step B6: Reboot operation is carried out similarly to as in step B1. At the same time, the program, table data and so forth are re-transferred from the fixed data area DOA of the external memory 52 to the data area DIA of the internal memory 55 (RD in FIG. 11).

Step B7: The data saved in step B3 is reloaded to the internal memory 55 (rereading and rewriting).

Steps B2 to B7 are repeated thereafter.

The mobile phone having short intermittent intervals (period TS shown in FIG. 11) may basically be operated based on the process flow A. The process flow A and process flow B, however, have respective problems. The process flow A, lowering the source voltage VM to be supplied to the internal memory 55 to the data-holding-guarantee voltage V1 in the power-save operation, is only limitative in terms of a range of lowering of the source voltage, which can only be effected down to the data-holding-guarantee voltage V1, and can therefore reduce the leakage current (power consumption) only to a certain limited degree. On the other hand, the process flow B, interrupting the power supply to the internal memory 55 in the power-save operation, essentially needs the reboot operation when the operation returns to the normal operation, and this requires a considerably long time and a large power consumption.

The process flow A, designed so as to lower the source voltage in an operation other than the normal operation, supervises whether the source voltage satisfies the data-holding-guarantee voltage or not. The actual internal memory has some margin over the data-holding-guarantee voltage, and the margin varies from product to product. The source voltage dropped down to the data-holding-guarantee voltage or below does not always mean destruction of the data held in the internal memory. There is, however, no unit capable of detecting whether the data has been destructed or not, so that the source voltage dropped down to the data-holding-guarantee voltage or below always resulted in reloading and resetting, assuming that all data have been destructed, even if the data have not actually been destructed. This is a large obstacle to reduction in the power consumption.

Patent Document 1 discloses a data inspection system of RAM equipped with a backup power source circuit.

(Patent Document 1) Japanese Patent Application Laid-open No. Hei 3-144838

SUMMARY OF THE INVENTION

It is an object of the present invention to make it possible to guarantee quality of data held in a semiconductor device having an internal memory, and to further reduce the power consumption.

According to the present invention, there is provided a semiconductor device which comprises: a first memory copying and holding a data held by a storage device; a second memory holding a check code of the data held by the first memory; a data check unit detecting error in the data held by the first memory based on the check code; and a reloading unit copying only the data corresponded to the block having a data error detected therein, from the storage device to the first memory, wherein the second memory is constantly supplied with a source voltage not lower than a data-holding-guarantee voltage, and the first memory is supplied with a positive source voltage lower than the data-holding-guarantee voltage in an operation other than the normal operation, such as in a power-save operation.

Provision of the data check unit, and guarantee of the check code of the data held in the first memory make it possible to detect any error in the data, and this consequently makes it possible to lower the source voltage to a level lower than the data-holding-guarantee voltage, while guaranteeing quality of data held in the first memory. In case of detection of data error, only the data corresponded to the block having the data error detected therein, rather than all data, is copied from the storage device to the first memory, and this enables quick return to the normal operational mode.

BRIEF DESCRIPTION OF THE DRAWINGS

FIGS. 9A to 9C are charts showing an exemplary operation of a mobile phone applied with the microcomputer system according to the individual embodiments;

DETAILED DESCRIPTION OF THE PREFERRED EMBODIMENTS

Next paragraphs will describe embodiments of the present invention referring to the attached drawings.

First Embodiment

Figure 1:
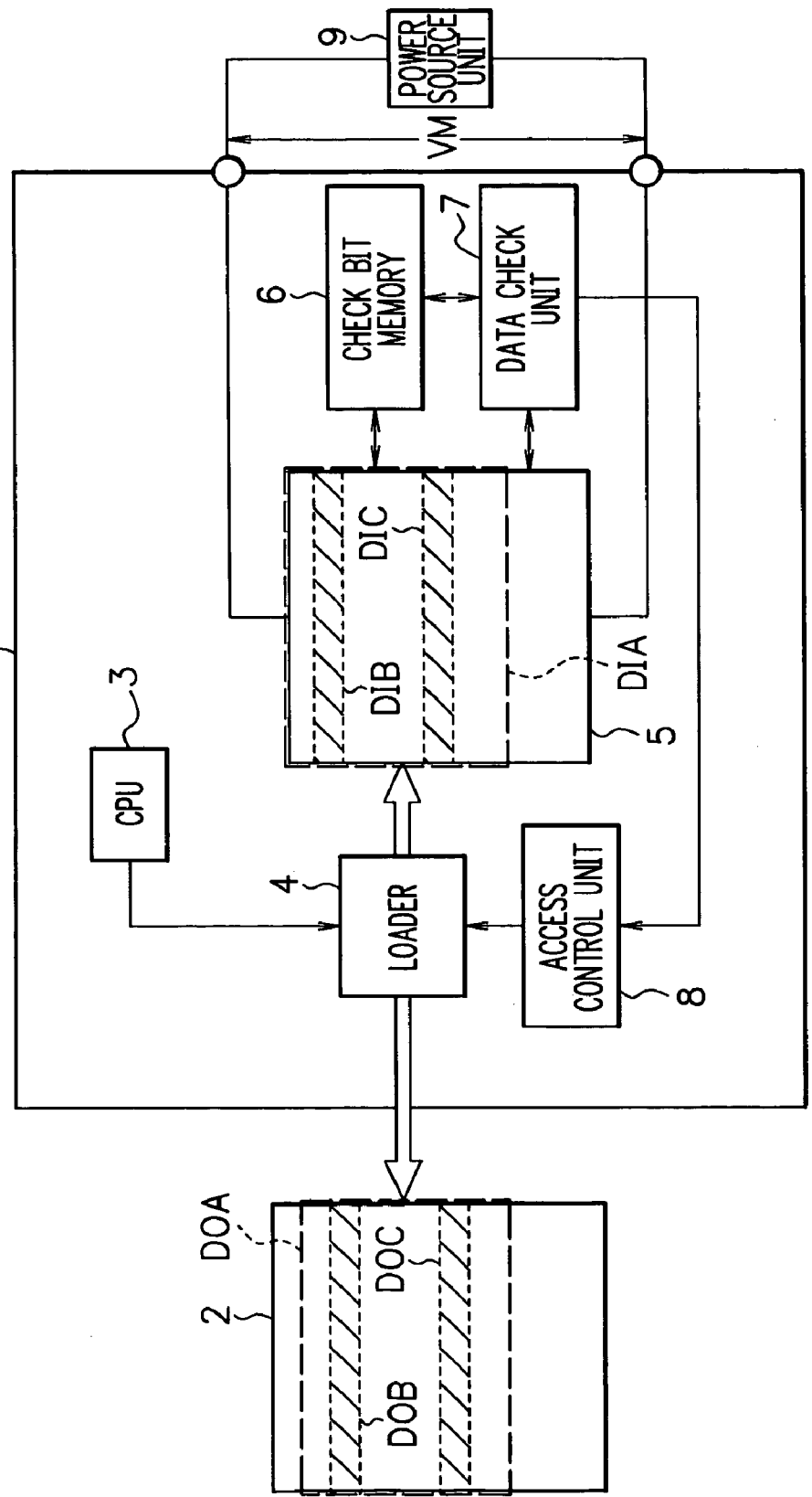
FIG. 1 is a block diagram showing an exemplary configuration of a microcomputer system applied with a semiconductor device according to a first embodiment of the present invention.

FIG. 1 is a block diagram showing an exemplary configuration of a microcomputer system applied with a semiconductor device according to a first embodiment of the present invention. The microcomputer system of the first embodiment comprises, as shown in FIG. 1, a microcomputer 1, an external memory 2, and a power source unit 9.

The microcomputer 1 has a processor (CPU) 3, a loader 4, an internal memory 5, a check bit memory 6, a data check unit 7, and an access control unit 8.

The processor 3 takes part in executing calculation and control of various functional units in the microcomputer system. The processor 3 operates based on a boot program stored in a ROM or the like, not shown, in the boot operation upon power-ON (or upon detection of any abnormality), and operates based on a program held in the internal memory 5 in the normal operation after completion of the boot operation.

The loader 4 copies a data held in the external memory 2 to the internal memory 5. More specifically, the loader 4 reads a data out from the external memory 2 based on address information supplied from the processor 3 and access control unit 8, and then writes thus-read data into the internal memory 5.

The external memory 2 is configured typically by a non-volatile memory such as flash memory, masked ROM, EEPROM (electrically erasable and programmable ROM) or the like. The external memory 2 holds programs for the processor 3, and data such as table data used for hardware setting, in the data area DOA thereof.

The internal memory 5 is configured by a volatile memory such as RAM, and corresponds to a work memory for the processor 3. The internal memory 5 will have and hold a data, held in the data area DOA of the external memory 2, written in the data area DIA thereof, via the loader 4 during the boot operation.

The check bit memory 6 is a memory storing a check code (check bit) used for detecting error in the data held in the internal memory 5. The check code is a redundancy bit as a verification code, generated and added by block coding of the data held in the internal memory 5 on a predetermined block basis (for every predetermined data length). CRC (cyclic redundancy check) is a typical coding process. The check code may be either even parity or odd parity.

The data check unit 7 reads the check code held in the check bit memory 6 and correspondent data held in the internal memory 5, and detects any error in the data held in the internal memory 5, based on thus-read data and check code. When any error was detected in the data held in the internal memory 5, the data check unit 7 posts the location of the error to the access control unit 8.

The access control unit 8 judges (generates and determines) an address information, used for reading the erroneous data out from the external memory 2, based on the location of the error posted by the data check unit 7, and supplies it to the loader 4.

The power source unit 9 is a unit capable of varying the output source voltage VM which is supplied to the internal memory 5.

Figure 2:
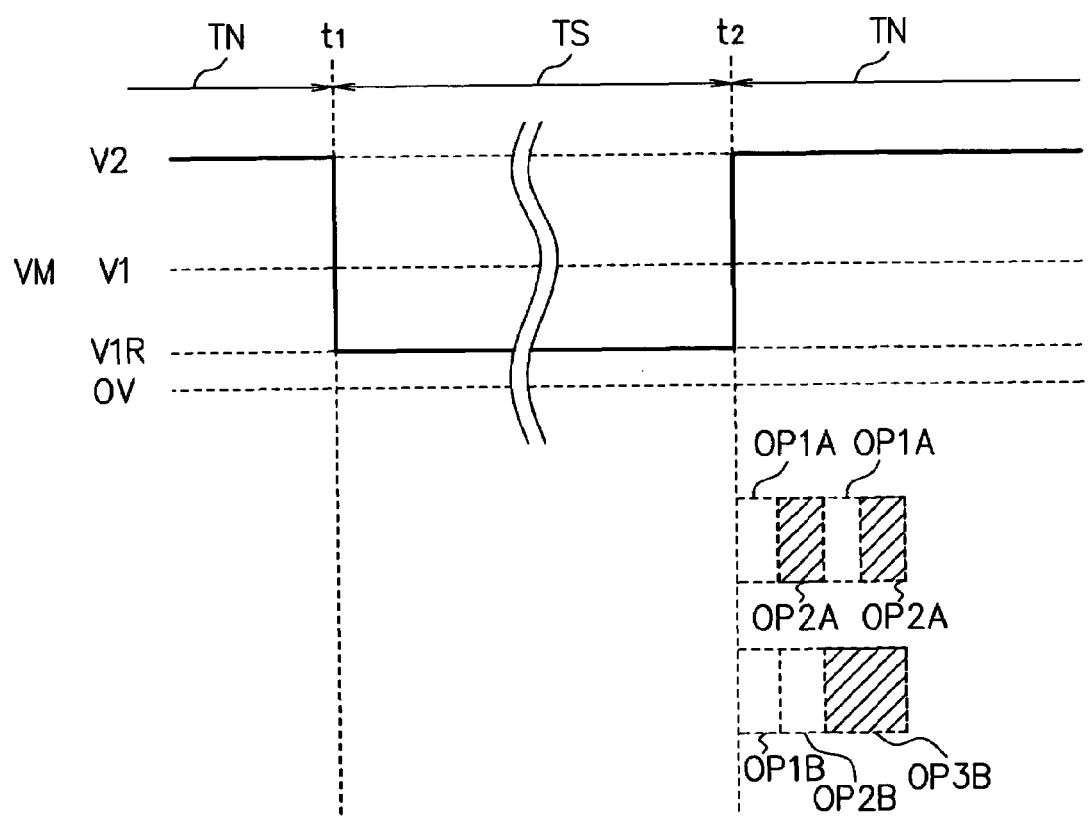
FIG. 2 is a drawing showing operations of the microcomputer system according to the first embodiment.
Figure 3:
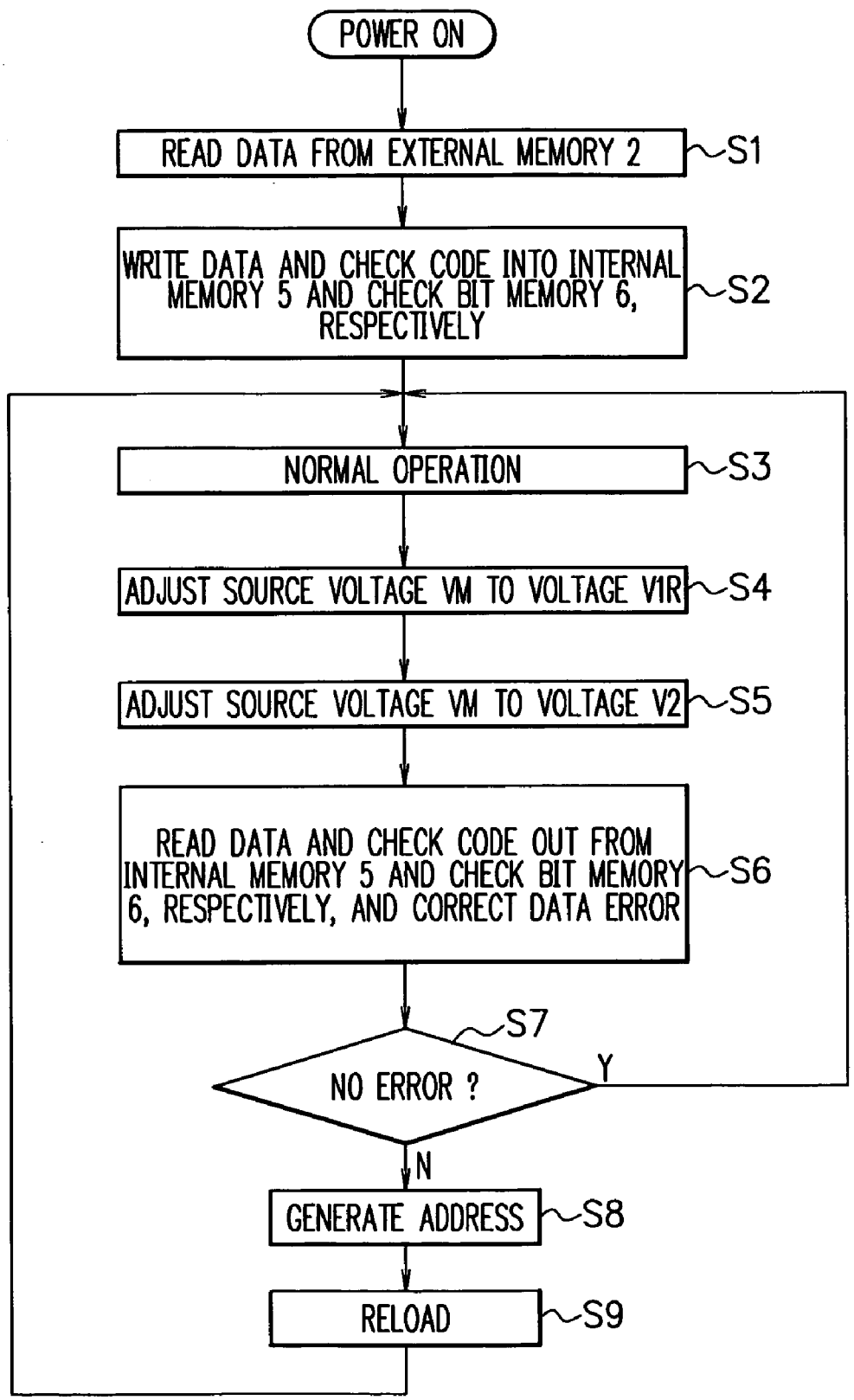
FIG. 3 is a flow chart showing operations of the microcomputer system according to the first embodiment.

Next paragraphs will explain the operations referring to FIG. 2 and FIG. 3.

FIG. 2 is a drawing showing a concept of the operations of the microcomputer system according to the first embodiment. FIG. 2 shows an intermittent operation in which the normal operation (period TN) and power-save operation (period TS) lower in the power consumption than in the normal operation are alternately repeated in the microcomputer system. For an exemplary case where the microcomputer system is applied to a mobile phone, the period TN of the normal operation corresponds to a period for sending/receiving data to and from a base station.

As shown in FIG. 2, at the time $t_1$ the operational mode of the microcomputer system is allowed to transit from the normal operation to the power-save operation, the power source unit 9 changes the source voltage VM to be supplied to the internal memory 5 from voltage V2 to voltage V1R. Voltage V2 is a normal operation voltage of the internal memory 5, and voltage V1R is a positive voltage lower than the data-holding-guarantee voltage V1 prescribed in the specification of the internal memory 5 but higher than 0 V.

The internal memory 5 herein operates at voltage V1R lower than the data-holding-guarantee voltage V1 in the period TS of the power-save operation, so that the leakage current in the internal memory 5 is successfully suppressed and the power consumption is reduced as compared with the conventional case. The check bit memory 6 is supplied with the source voltage equivalent to that supplied in the period TN of the normal operation, even in the period TS of power-save operation. In other words, the check bit memory 6 is constantly supplied with the normal operation voltage irrespective of the operational modes of the microcomputer system. On the other hand, supply of the source voltage to the individual functional units (processor 3, loader 4, data check unit 7, access control unit 8, etc.) owned by the microcomputer 1, except for the internal memory 5 and check bit memory 6, is interrupted (source voltage is 0 V).

When the operational mode of the microcomputer system is recovered from the power-save operation into the normal operation at time $t_2$ after the elapse of period TS from time $t_1$, the power source unit 9 sets the source voltage VM to be supplied to the internal memory 5 to voltage V2. The source voltage is supplied again also to the individual functional units owned by the microcomputer 1, except for the internal memory 5 and check bit memory 6.

The data check unit 7 herein reads a data of one block in a predetermined block-wise manner out from the internal memory 5, and at the same time reads a check code corresponded thereto out from the check bit memory 6, to thereby detect error in the data (operation OP1A).

If any error was found in the data, the site of occurrence of the error is posted by the data check unit 7 to the access control unit 8, and an address information correspondent to the data in the external memory 2 is supplied to the loader 4. The loader 4 reads only the data (the block containing the data) having the error detected therein out from the external memory 2 based on thus-supplied address information, and writes (reloads) it to the internal memory 5, to thereby update the erroneous data (operation OP2A). Next, a data of the next block and a correspondent check code are read out respectively from the internal memory 5 and check bit memory 6.

On the other hand, when no error was found in the data, a data of the next block and a correspondent check code are read out respectively from the internal memory 5 and check bit memory 6. In other words, return from the power-save operation to the normal operation is not accompanied by reloading from the external memory 2 if the data has no error.

Thereafter, all data held in the data area DIA of the internal memory 5 are similarly subjected to the error detection.

The above explanation dealt with the case where the error detection of data is carried out in a block-wise manner (operation OP1A), and the data is reloaded every time the error was detected (operation OP2A). It is, however, also allowable to carry out the error detection of data (operation OP1B), to accumulate the address information correspondent to the erroneous data typically in the access control unit 8 (operation OP2B), and to reload only the erroneous data en bloc after the error detection was completed for all of the data to be checked (operation OP3B).

FIG. 3 is a flow chart showing operations of the microcomputer system according to the first embodiment. As described in the above, the check bit memory 6 is constantly supplied with the normal operation voltage irrespective of the operational mode of the microcomputer system.

Upon power-ON, the processor 3 reads the boot program stored in a ROM or the like, not shown, and executes it. The loader 4 reads data, such as programs, table data and so forth out from the data area DOA of the external memory 2, following instructions of the processor 3 (step S1). Next, the read-out data and a correspondent check code are written in the data area DIA of the internal memory 5 and the check bit memory 6, respectively (step S2).

The check code to be written into the check bit memory 6 may be generated typically by the data check unit 7, using a data read out from the external memory 2. It is still also allowable to preliminarily generate it, and to store it in the external memory 2 for later reading together with the data. The preliminary generation thereof and later reading together with the data is advantageous in that any processing based on a check code generation logic is no more necessary, so that the process time can be shortened and the power consumption can be reduced.

In this way, the data copy from the data area DOA of the external memory 2 into the data area DIA of the internal memory 5, and boot operation such as various initial settings by the processor 3 are performed.

The processor 3 starts the normal operation processing based on the program held in the internal memory 5 by the boot operation (step S3).

After completion of the normal operation, the operational mode of the microcomputer system is allowed to transit from the normal operation to the power-save operation. The source voltage VM to be supplied from the power source unit 9 to the internal memory 5 is set to V1R (step S4).

After the elapse of a predetermined period of time, the operational mode of the microcomputer system is recovered from the power-save operation to the normal operation. The source voltage VM to be supplied from the power source unit 9 to the internal memory 5 is raised to V2 (step S5).

Next, the data check unit 7 reads a data in a predetermined block-wise manner out from the data area DIA of the internal memory 5, and at the same time reads a check code corresponded thereto out from the check bit memory 6, to thereby detect error in the read-out data (step S6).

If the data was judged by the data check unit 7 as having no error ("Y" in step S7), the process returns to step S3 for the normal operation.

On the other hand, when the data was judged as having any error ("N" in step S7), an address information of the external memory 2 corresponded to the data read out in step S6 is generate by the access control unit 8 (step S8). For example, if the data read out in step S6 is a data held in the data area DIB in the data area DIA of the internal memory 5, an address information specifying the data area DOB in the data area DOA of the external memory 2 having, as being held therein, a data corresponded to the data, is generated. Similarly, if it is a data held in the data area DIC in the data area DIA, an address information specifying the data area DOC in the data area DOA is generated.

Next, the data is reloaded by the loader 4 from the data area of the external memory 2 specified by the address information into the correspondent data area of the internal memory 5 (step S9), and the process returns back to step S3 for the normal operation.

The intermittent operations of the normal operation and power-save operation of the microcomputer system proceed in this way.

In the first embodiment, the block-wise check code of the data to be copied from the external memory 2 into the internal memory 5 is held in the check bit memory 6. During the power-save operation, the check bit memory 6 is supplied with a source voltage equivalent to that in the normal operation, and the internal memory 5 is supplied with the positive voltage V1R, lower than the data-holding-guarantee voltage V1, as the source voltage VM. When the operational mode is allowed to transit from the power-save operation to the normal operation, the error detection of the data held in the internal memory 5 is carried out based on the check code held in the check bit memory 6, and only the erroneous data (block) is reloaded from the external memory 2 into the internal memory 5.

This makes it possible to detect any error of the data held in the internal memory 5, so that requirements on holding of the data in the internal memory 5 can be moderated, even allowing some error to occur, and so that the source voltage VM to be supplied to the internal memory 5 during the power-save operation can be lowered to a level lower than the data-holding-guarantee voltage V1. This is successful in reducing the leakage current in the internal memory 5, and consequently in reducing the power consumption. Any data error detection results in reloading only of the erroneous data (block), rather than all data, from the external memory 2 into the internal memory 5, and this makes it possible to guarantee quality of data held in the internal memory 5, to allow the operational mode to transit from the power-save operation to the normal operation within a short processing time, and to reduce the power consumption in the transit between the operational modes.

Second Embodiment

Next paragraphs will describe a second embodiment of the present invention.

Figure 4:
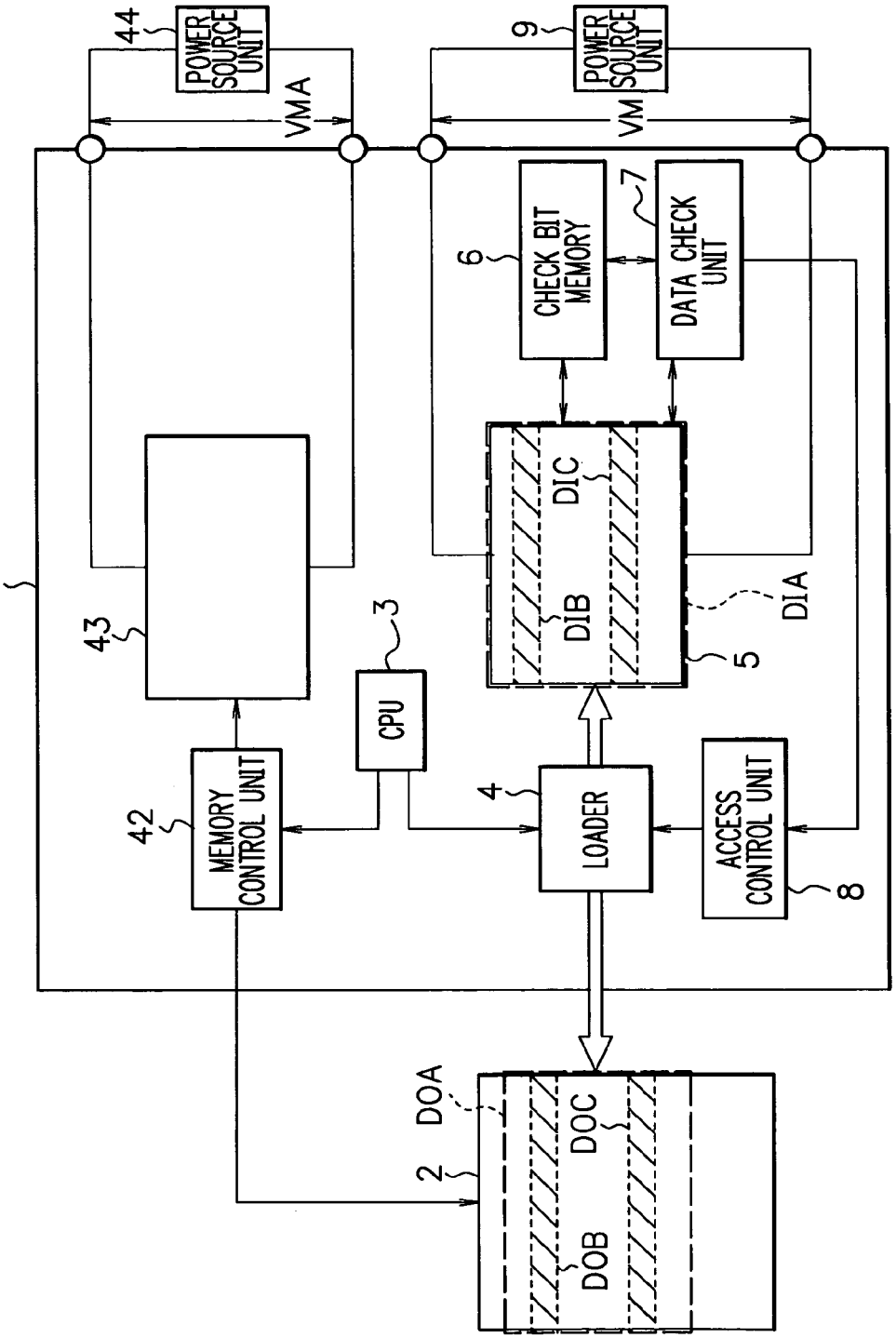
FIG. 4 is a block diagram showing an exemplary configuration of a microcomputer system applied with a semiconductor device according to a second embodiment of the present invention.

FIG. 4 is a block diagram showing an exemplary configuration of the microcomputer system applied with the semiconductor device according to the second embodiment of the present invention. In FIG. 4, any blocks or the like having functions identical to those shown in FIG. 1 will be given with the same reference numerals, omitting the repetitive explanation.

The microcomputer system of the second embodiment has a microcomputer 41, the external memory 2, the power source unit 9 and a power source unit 44.

The microcomputer 41 has the processor (CPU) 3, the loader 4, the first internal memory 5, the check bit memory 6, the data check unit 7, the access control unit 8, a memory control unit 42 and a second internal memory 43.

The first internal memory 5 and the second internal memory 43 correspond to a work memory of the processor 3, and are individually composed of a non-volatile memory such as RAM.

More specifically, the first internal memory 5 is a memory holding a fixed data not affected by rewriting (update) of data during the normal operation. The fixed data held in the data area DOA of the external memory 2, such as programs for the processor 3, table data used for hardware setting, are written in the data area DIA (internal memory 5) by the boot operation.

The second internal memory 43 holds a variable data affected by writing (rewriting) of data during the normal operation.

The internal memories 5, 43 are supplied with voltage V2 during the normal operation, and with voltage V1R during the power-save operation, as the source voltages VM, VMA from the power source units 9, 44, respectively.

The memory control unit 42 reads data out from the second internal memory 43 and writes it into the external memory 2, or inversely reads data out from the external memory 2 and writes it into the second internal memory 43, following instructions of the processor 3. In the second embodiment, the external memory 2 is therefore configured by a data-rewritable, non-volatile memory such as flash memory or EEPROM.

In thus configured microcomputer system of the second embodiment, the variable data held in the second internal memory 43, and hardly causing data writing (low writing frequency), is copied from the second internal memory 43 to the external memory 2, when the operational mode is allowed to transit from the normal operation to the power-save operation. This makes it possible to lower the source voltage VMA to be supplied to the internal memory 43 during the power-save operation, to a level lower than the data-holding-guarantee voltage V1, even if the internal memory 43 holds the variable data different from the data held by the external memory 2 from the beginning. This is successful in obtaining the effects similar to those in the first embodiment, and in further reducing the power consumption because of increase in a ratio of memories expectedly having a lowered source voltage. It is to be noted that the operations of the microcomputer system in the second embodiment are similar to those in the first embodiment, except for the processing relevant to the internal memory 43.

In the first and second embodiments, it is all enough to appropriately determine voltage V1R to be supplied to the internal memory 5 (and internal memory 43) during the power-save operation, typically depending on the amount of reduction in the power consumption during the power-save operation period through lowering in the source voltage VM (VMA), error rate of the held data, and power consumption during the reloading of the erroneous data from the external memory 2 into the internal memory 5.

In the first and second embodiments, it is also made possible to reduce the number of times of reloading when the operational mode is allowed to transit from the power-save operation to the normal operation, by configuring a predetermined block unit for generating the check code of the data held by the internal memory 5 so as to be adapted to characteristics of the internal memory 5, such as magnitude (data length) of erroneous data bursts in the data held in the internal memory 5. This is therefore successful in further shorten the process time, and at the same time, in further reducing the power consumption. It is also allowable to adjust the block unit for the block coding, so as to make the unit (e.g., units in the word line direction and bit line direction) more likely to have successive data error occurred therein, depending on the configuration and characteristics of the internal memory 5.

In the first and second embodiments, the check bit memory 6 was designed to hold the check code obtained by block coding of the data to be held by the internal memory 5, whereas it is also allowable that the internal memory 5 holds the check code, and the check bit memory 6 holds the check code obtained by further block-coding of the check code. This is successful in reducing the memory size of the check bit memory 6, in reducing the power consumption, and in reducing the circuit area.

Third Embodiment

Next paragraphs will describe a third embodiment of the present invention.

In the internal memory of the microcomputer, the lower limit of the data-holding-enable voltage capable of guaranteeing the held data depends on the process and environment of use (temperature, etc.). The third embodiment is to make it possible to appropriately set the source voltage to be supplied to the internal memory during the power-save operation, depending on characteristics of the semiconductor device.

Figure 5:
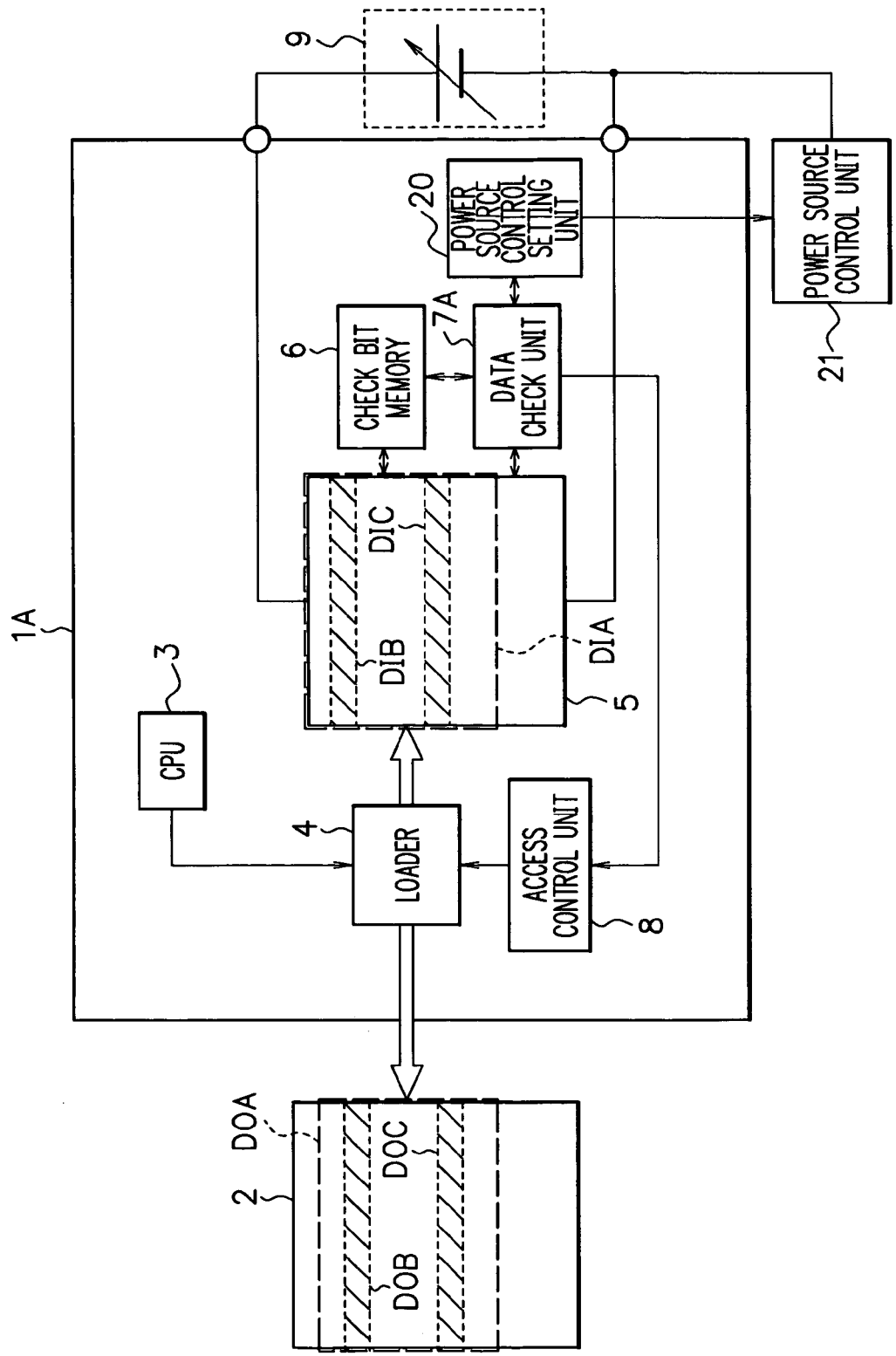
FIG. 5 is a block diagram showing an exemplary configuration of a microcomputer system applied with a semiconductor device according to a third embodiment of the present invention.

FIG. 5 is a block diagram showing an exemplary configuration of the microcomputer system applied with the semiconductor device according to the third embodiment of the present invention. In FIG. 5, any blocks or the like having functions identical to those shown in FIG. 1 will be given with the same reference numerals, omitting the repetitive explanation.

The microcomputer system of the third embodiment has, as shown in FIG. 5, a microcomputer 1A, the external memory 2, the power source unit 9 and a power source control unit 21.

The microcomputer 1A has the processor (CPU) 3, the loader 4, the internal memory 5, the check bit memory 6, a data check unit 7A, the access control unit 8, and a power source control setting unit 20.

The data check unit 7A respectively reads out a check code held in the check bit memory 6 and a correspondent data held in the internal memory 5, and carries out error detection of the data held in the internal memory 5 based on thus-read data and check code. The data check unit 7A posts the detection results of any data error to the power source control setting unit 20, and posts the site of occurrence of the error, if found in the data held in the internal memory 5, to the access control unit 8.

The power source control setting unit 20 sets a value of voltage to be supplied to the internal memory 5 on the power source control unit 21, based on the detection results of data error posted by the data check unit 7A. The power source control unit 21 controls the power source unit 9, which is capable of varying the output voltage based on the setting by the power source control setting unit 20.

More specifically, the value of source voltage, supplied by the power source unit 9 to the internal memory 5 during the power-save operation, is set by the power source control setting unit 20 on the power source control unit 21, based on the detection results of the data error (whether any data error was found or not) by the data check unit 7A, and based on the setting, the power source control unit 21 controls output voltage of the power source unit 9. The present set value of the source voltage to be supplied to the internal memory 5 is held by the power source control setting unit 20.

By setting the lower limit of (data-holding-enable) voltage not causative of any data error in the internal memory 5 based on the state of occurrence of data error, the third embodiment therefore makes it possible to appropriately supply the lower limit voltage, adapted to characteristics or the like of the microcomputer 1A, from the power source unit 9 to the internal memory 5 during the power-save operation, to thereby guarantee the data held in the internal memory 5, and to reduce the power consumption.

In the microcomputer 1A herein in the third embodiment, the internal memory 5 and power source control setting unit 20 during the power-save operation are supplied with the source voltage similarly to as during the normal operation, wherein the internal memory 5 is supplied with the lower limit voltage within a range not causative of data error, set by the power source control setting unit 20. The processor 3, loader 4, data check unit 7A and access control unit 8 are disconnected from the source voltage supply during the power-save operation.

Figure 6:
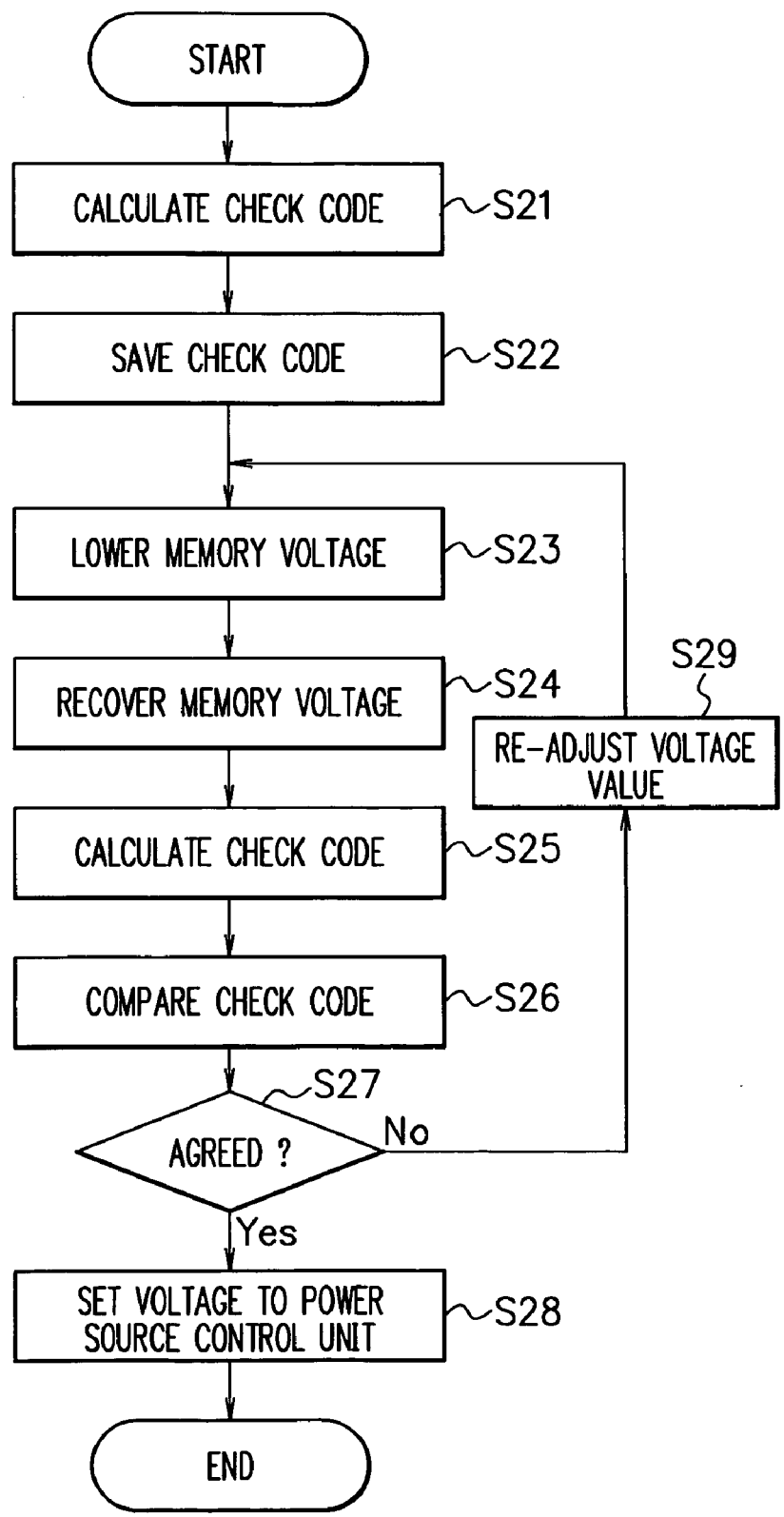
FIG. 6 is a flow chart showing memory voltage setting operation of the microcomputer system according to the third embodiment.
Figure 7:
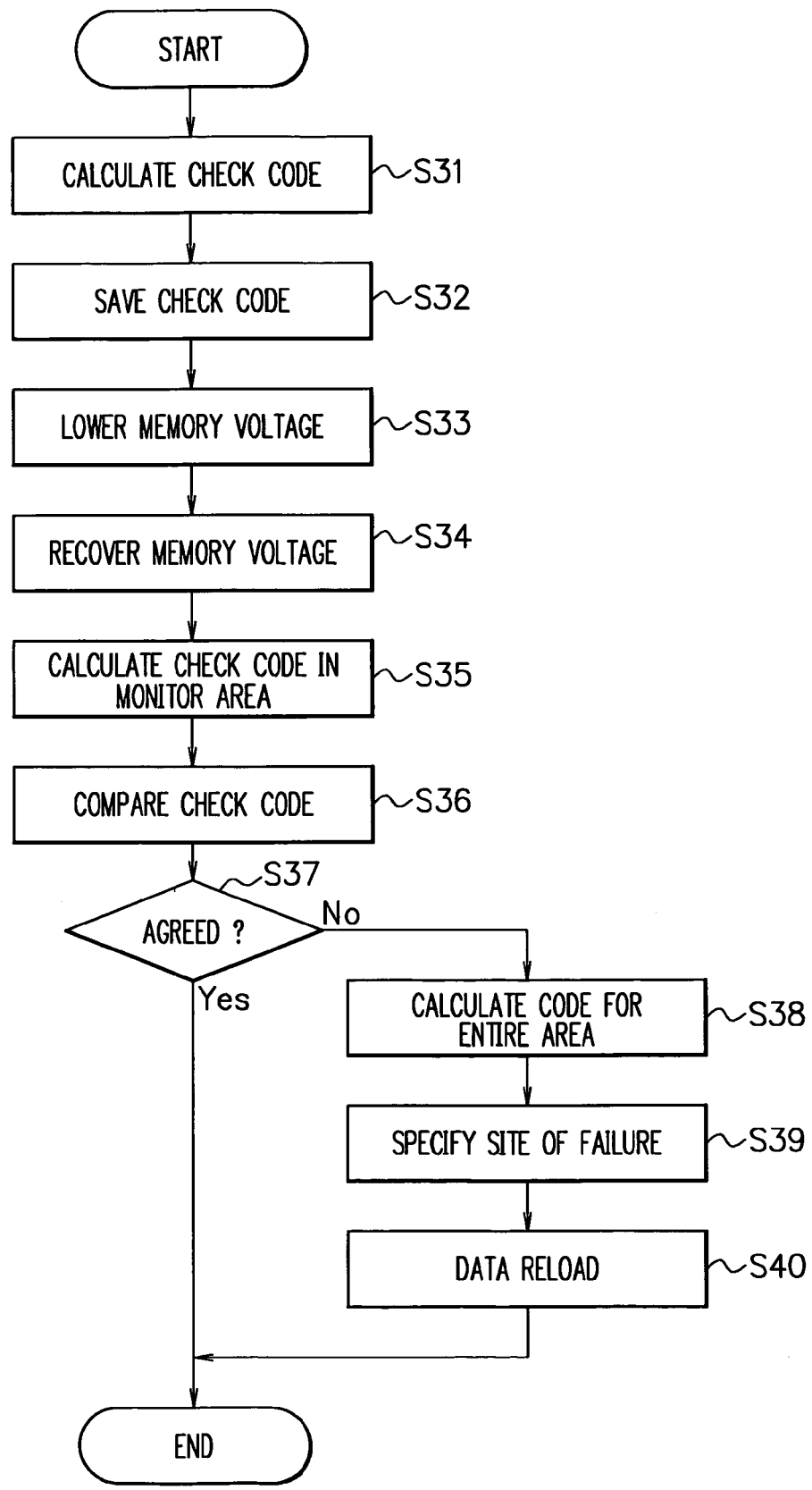
FIG. 7 is a flow chart showing an intermittent operation of the microcomputer system according to the third embodiment.

Next paragraphs will explain the operations referring to FIG. 6 and FIG. 7.

FIG. 6 is a flow chart showing operations of the microcomputer system in the third embodiment, and more specifically, memory voltage setting operations for the purpose of setting the lower voltage value not causative of data error in the internal memory 5. The operations shown in FIG. 6 is to gradually raise a set value of the source voltage to be output from the power source unit 9 to the internal memory 5, from a lower value depending on the detection results of data error. More specifically, the set value of the source voltage to be output to the internal memory 5 is re-adjusted to the next higher level when the data error was detected, and the lower limit value not causative of data error is determined as the source voltage to be supplied to the internal memory 5 during the power-save operation.

When the memory voltage setting operation starts, the loader 4 reads, if necessary, data such as programs and table data out from the data area DOA of the external memory 2, following instructions of the processor 3. The data check unit 7A herein uses the data thus read out from the external memory 2 to calculate a check code (check bit) correspondent to the data (step S21).

Next in step S21, the data read out from the external memory 2 is written in the data area DIA of the internal memory 5, and the check code calculated by the data check unit 7A is written in the check bit memory 6 (step S22).

It is also allowable to preliminarily calculate the check code relevant to the data and to store it in the external memory 2, then to read out the check code together with the data and store them in the data area DIA of the internal memory 5 and the check bit memory 6, respectively. This is successful in getting rid of any processing through check code generation logic, and consequently in reducing the process time and in reducing the power consumption.

After copying the data from the data area DOA of the external memory 2 to the data area DIA of the internal memory 5 in this way, the source voltage (memory voltage) to be supplied from the power source unit 9 to the internal memory 5 is lowered (step S23). More specifically, the power source control setting unit 20 sets a value of the source voltage allowing the internal memory 5 to transit to the power-save mode on the power source control unit 21, and the power source control unit 21 then controls the power source unit 9. The source voltage to be supplied from the power source unit 9 to the internal memory 5 is thus lowered to a predetermined voltage value, to thereby allow the internal memory 5 to transit from the normal operation mode to the power-save mode. It is to be noted that the set value of the source voltage to be supplied to the internal memory 5 immediately after completion of the data copy is preliminarily determined and set on the power source control setting unit 20, typically to a voltage around 0 V.

After the elapse of a predetermined period of time, the source voltage (memory voltage) to be supplied from the power source unit 9 to the internal memory 5 is returned to a voltage value equivalent to that in the normal operation mode, to thereby allow the internal memory 5 to transit to the normal operation mode (step S24).

Next, the data check unit 7A reads the data from the data area DIA of the internal memory 5, and uses thus-read data to calculate a check code (step S25).

Next, the data check unit 7A reads the check code, correspondent to the data read out from the internal memory 5 in step S25, out from the check bit memory 6, and compares thus-read check code with the check code calculated in step S25. In other words, the data check unit 7A carries out error detection of data in the internal memory 5, by judging whether the check code calculated based on the data read out from the internal memory 5 in step S25 coincides with the check code correspondent to the data held in the check bit memory 6 or not (step S26).

When any error in the data was detected by the data check unit 7A in the data error detection in step S26, or it was judged that both check codes did not agree ("No" in step S27), the data check unit 7A posts the result to the power source control setting unit 20. Upon posting, the power source control setting unit 20 re-adjusts the set value of the source voltage, which is to be output to the internal memory 5 so as to allow it to transit to the power-save mode, to the next higher level over the current set value (step S29). Values of the individual levels (step width) of the source voltage set by the power source control setting unit 20 are arbitrary, wherein the set values of the individual levels may be set at regular intervals (constant potential difference), or intervals of the individual levels of the set values may be varied from level to level.

After the power source control setting unit 20 re-adjusts the set value of the source voltage to be supplied to the internal memory 5 in step S29, the process returns back to step S23, and the processes in step S23 and thereafter are repeated. Although not shown, the data held in the internal memory 5 is destroyed (erroneous) in the process of going back to step S23, so that the data is read (reloaded) out from the external memory 2 and is written in the internal memory 5, prior to repetition of the processes in step S23 and thereafter.

On the other hand, when no error in the data was detected by the data check unit 7A in the data error detection in step S26, or it was judged that both check codes agreed ("Yes" in step S27), the data check unit 7A posts the result to the power source control setting unit 20. Upon posting, the power source control setting unit 20 sets, on the power source control unit 21, the current set value as a lower limit value of the source voltage not causative of data error in the internal memory 5.

As described in the above, in the memory voltage value setting operation shown in FIG. 6, the source voltage to be supplied from the power source unit 9 to the internal memory 5 is once lowered to a voltage around 0 V, then returned back to the normal operation voltage, and the error detection of data is carried out by the data check unit 7A. If any data error was found, the result is posted to the power source control setting unit 20, and the voltage value when the voltage to be supplied to the internal memory 5 is lowered is re-adjusted to the next higher level. The data error detection was carried out again, after the source voltage to be supplied to the internal memory 5 is lowered and returned back to the normal operation voltage. By repeating the operations until no data error will be found, while gradually raising the voltage value when the voltage to be supplied to the internal memory 5 is lowered, the voltage value, not causative of data error even under a lowered voltage in the internal memory 5, is obtained.

By these procedures, the lower limit value of the source solvate capable of guaranteeing data held in the internal memory 5 is obtained based on the detection results of the data error by the data check unit 7A, and thus-obtained value is set as the source voltage to be supplied from the power source unit 9 to the internal memory 5 during the power-save operation. This consequently makes it possible to lower the source voltage to be supplied to the internal memory 5 during the power-save operation to the lower limit voltage value not causative of data error, to reliably guarantee the data held in the internal memory 5, to reduce the leakage current in the internal memory 5, and to reduce the power consumption.

It is to be noted that, in the explanation in the above, the lower limit value of the source voltage, not causative of the data error in the internal memory 5, was set by gradually raising a set value of the source voltage to be output from the power source unit 9 to the internal memory 5, from a lower value depending on the detection results of data error.

It is, however, also allowable to adjust a set value of the source voltage to be output from the power source unit 9 to the internal memory 5, while gradually lowering it from a higher value depending on the detection result of data error. When no data error was found, the set value is gradually lowered by re-adjusting the set value of the source voltage to be output to the internal memory 5 to the next lower level below the current set value, and a set value immediately before the set value causing the first data error is set as the lower limit value of the source voltage not causative of data error in the internal memory 5. In this case, it is all enough to set an initial value for the set value of the source voltage to be supplied to the internal memory 5 typically to the data-holding-guarantee voltage V1.

More specifically, in the flow chart shown in FIG. 6, the branching conditions in step S27 are inverted, so that the power source control setting unit 20 re-adjusts the set value of the source voltage to be supplied to the internal memory 5 to the next lower value below the current set value in step S29, when no data error was found in the data error detection by the data check unit 7A in step S26, or it was judged that both check codes agreed.

On the other hand, when the data error was found by the data check unit 7A in the data error detection in step S26, or it was found that both check codes did not agree, the power source control setting unit 20 sets just preceding set value (a set value of a level one-step higher than the current set value) of the current set value as the lower limit value of the source voltage not causative of the data error, on the power source control unit 21 in step S28.

Also in this way, it is made possible to determine the lower limit value of the source voltage capable of guaranteeing the data holding in the internal memory 5, based on the detection result of data error by the data check unit 7A, and to set it as the source voltage to be supplied from the power source unit 9 to the internal memory 5 during the power-save operation. It is no more necessary to reload the data from the external memory 2 to the internal memory 5 when the set value of the source voltage to be supplied to the internal memory 5 is re-adjusted for the data error detection, and this makes it possible to reduce process volume necessary for the memory voltage value setting operation, to thereby reduce the power consumption.

FIG. 7 is a flow chart showing intermittent operations of the microcomputer system of the third embodiment. FIG. 7 shows a series of operation flow in which the operational mode of the microcomputer system is allowed to transit from the normal operation to the power-save operation, and then allowed to return from the power-save operation back into the normal operation.

It is to be noted as described in the above that the check bit memory 6 and the power source control setting unit 20 in the microcomputer 1A are constantly supplied with the normal operation voltage, irrespective of the operational mode of the microcomputer system.

In the description below, the normal operation voltage of the internal memory 5 is denoted as V2, and a voltage set by the above-described memory voltage value setting operation, that is, the lower limit value of the source voltage not causative of data error in the internal memory 5, is denoted as V1R. The source voltage to be supplied from the power source unit 9 to the internal memory 5 is voltage V2 for the normal operation, and V1R for the power-save operation. The source voltage to be supplied to the internal memory 5 is controlled by the power source control setting unit 20, the power source control unit 21, and the power source unit 9.

First, the data check unit 7A uses a data to be written in the data area DIA of the internal memory 5 to calculate a check code (check bit) correspondent to the data (step S31). The data is written in the data area DIA of the internal memory 5, and the check code calculated by the data check unit 7A is written in the check bit memory 6 (step S32).

Writing of data in the data area DIA of the internal memory 5 is thus performed.

In steps S31, S32 immediately after the power-ON, the following operations proceed.

First, the loader 4 reads data, such as programs, table data and so forth, out from the data area DOA of the external memory, following instructions of the processor 3. The data check unit 7A uses the data thus-read from the external memory 2 to calculate a check code (check bit) correspondent to the data (step S31). Next, the data read out from the external memory 2 in step S31 is written into the data area DIA of the internal memory 5, and the check code calculated by the data check unit 7A is written into the check bit memory 6 (step S32). It is also allowable herein to preliminarily calculate the check code relevant to the data and to store it in the external memory 2, then to read out the check code together with the data and store them in the data area DIA of the internal memory 5 and the check bit memory 6, respectively. This is successful in getting rid of any processing through a check code generation logic, and consequently in reducing the process time and reduction in the power consumption.

Copying data from the data area DOA of the external memory 2 into the data area DIA of the internal memory 5 is performed in this way.

After completion of the above-described processing, the operational mode of the microcomputer system is allowed to transit from the normal operation to the power-save operation. The source voltage (memory voltage) to be supplied from the power source unit 9 to the internal memory 5 is lowered from voltage V2 to voltage V1R (step S33). At the same time, the individual functional units owned by the microcomputer 1A (processor 3, loader 4, data check unit 7A and access control unit 8), excluding the internal memory 5, check bit memory 6, and power source control setting unit 20, are disconnected from the source voltage supply.

After the elapse of a predetermined period of time, the operational mode of the microcomputer system is recovered from the power-save operation to the normal operation. The source voltage (memory voltage) to be supplied from the power source unit 9 to the internal memory 5 is returned from voltage V1R back to the normal operation voltage V2 (step S34). At the same time, the individual functional units owned by the microcomputer 1A (processor 3, loader 4, data check unit 7A, and access control unit 8, etc.) are also supplied with the normal operation voltage.

Next, the data check unit 7A reads the data from a monitor area of the internal memory 5, and calculates a check code using thus-read data (step S35).

The monitor area is a predetermined area preliminarily set in a part of the data area DIA so as to allow simple judgment on whether any data error occurred in the internal memory 5 or not. The monitor area can variably be set, and is set to an area worst in the memory (storage element) characteristic (an area of worst characteristic) in the internal memory 5. For example, the monitor area can be set to the area furthest from the power source unit of the internal memory 5, or it is also allowable to arbitrarily produce an area having a poor characteristic in the internal memory 5, and to specify the area as the monitor area, if this sort of production is possible.

Next, the data check unit 7A reads the check code correspondent to the data read out from the monitor area of the internal memory 5 in step S35, out from the check bit memory 6. The data check unit 7A compares thus-read check code and the check code calculated in step S35, to thereby carry out the data error detection (step S36).

If the data check unit 7A judges that there is no data error found in the monitor area of the internal memory 5, or both check codes agreed ("Yes" in step S37), it is understood that no data error are found over the entire data area DIA of the internal memory 5, and this results in the normal operation.

On the other hand, if any error was found in the data in the monitor area of the internal memory 5 from the results of the data error detection, that is, both check codes did not agree ("No" in step S37), the data check unit 7A reads the data out from the entire data area DIA of the internal memory 5. The data check unit 7A then uses thus-read data to calculate the check codes for the entire data area DIA (step S38).

The data check unit 7A reads the check codes correspondent to the individual data read out from the internal memory 5 in step S38, that is, the individual data of the entire data area DIA, out from the check bit memory 6. The data check unit 7A compares thus-read check code and the check code calculated in step S38 for the data error detection, to thereby locate sites of failure where any data error occurred (step S39).

After locating all sites of failure in step S38, address information of the external memory 2 corresponded to thus-located sites of failure is generated by the access control unit 8. Data is then reloaded by the loader 4 from the data area of the external memory 2 specified by thus-generated address information into the correspondent data area of the internal memory 5 (step S40). The reloading of the data from the external memory 2 into the internal memory 5 is followed by the normal operation processing.

Repetition of the above-described operations results in the intermittent operation of the normal operation and the power-save operation of the microcomputer system.

According to the third embodiment, it is made possible to determine the lower limit value of the source voltage capable of guaranteeing the data holding in the internal memory 5, based on the detection result of data error by the data check unit 7A, and the voltage to be supplied from the power source unit 9 to the internal memory 5 during the power-save operation can be lowered to as low as the lower limit value of the source voltage capable of guaranteeing the data holding in the internal memory 5, which is lower than the data-holding-guarantee voltage prescribed typically in the specification. This consequently makes it possible to reduce the power consumption, while reliably guaranteeing data held in the internal memory 5. By determining the lower limit value of the source voltage capable of guaranteeing the data holding in the internal memory 5 for every microcomputer 1A, and by setting it as the voltage value to be supplied to the internal memory 5 during the power-save operation, it is made possible to appropriately set the voltage value adaptive to the characteristics of the microcomputer 1A.

In the transit of the operational mode from the power-save operation to the normal operation, the data error detection is carried out for the monitor area, which is a partial area of the data area DIA of the internal memory 5 and having characteristics poorer than those in other data areas. Absence of erroneous data in the monitor area is understood as absence of erroneous data also in the entire data area DIA, so that the data error detection for the entire data area DIA will be omissible, and this makes it possible to reduce the process volume and to raise the process speed of the data check processing.

If any erroneous data should occur in the monitor area, sites of the erroneous data are located through the data error detection over the entire data area DIA, to thereby locate the erroneous data, and only the data found to be erroneous, rather than all data, is reloaded from the external memory 2 to the internal memory 5. This is successful in shortening the transition time from the power-save operation to the normal operation without reboot operation, and also in reducing the power consumption necessary for the transition between the operational modes. This is also successful in guaranteeing the data in the internal memory 5.

It is to be noted that, in the intermittent operation of the microcomputer system shown in FIG. 7 in the above, the data error detection covers the entire data area DIA of the internal memory 5, only when the data error was found to occur in the monitor area set in the internal memory 5, whereas it is also allowable to appropriately carry out the data error detection for the entire data area DIA, irrespective of whether the data error occurred or not in the monitor area. In this case, the data error detection may be, or may not be carried out for the monitor area, when the data error detection covers the entire data area DIA.

Figure 8:
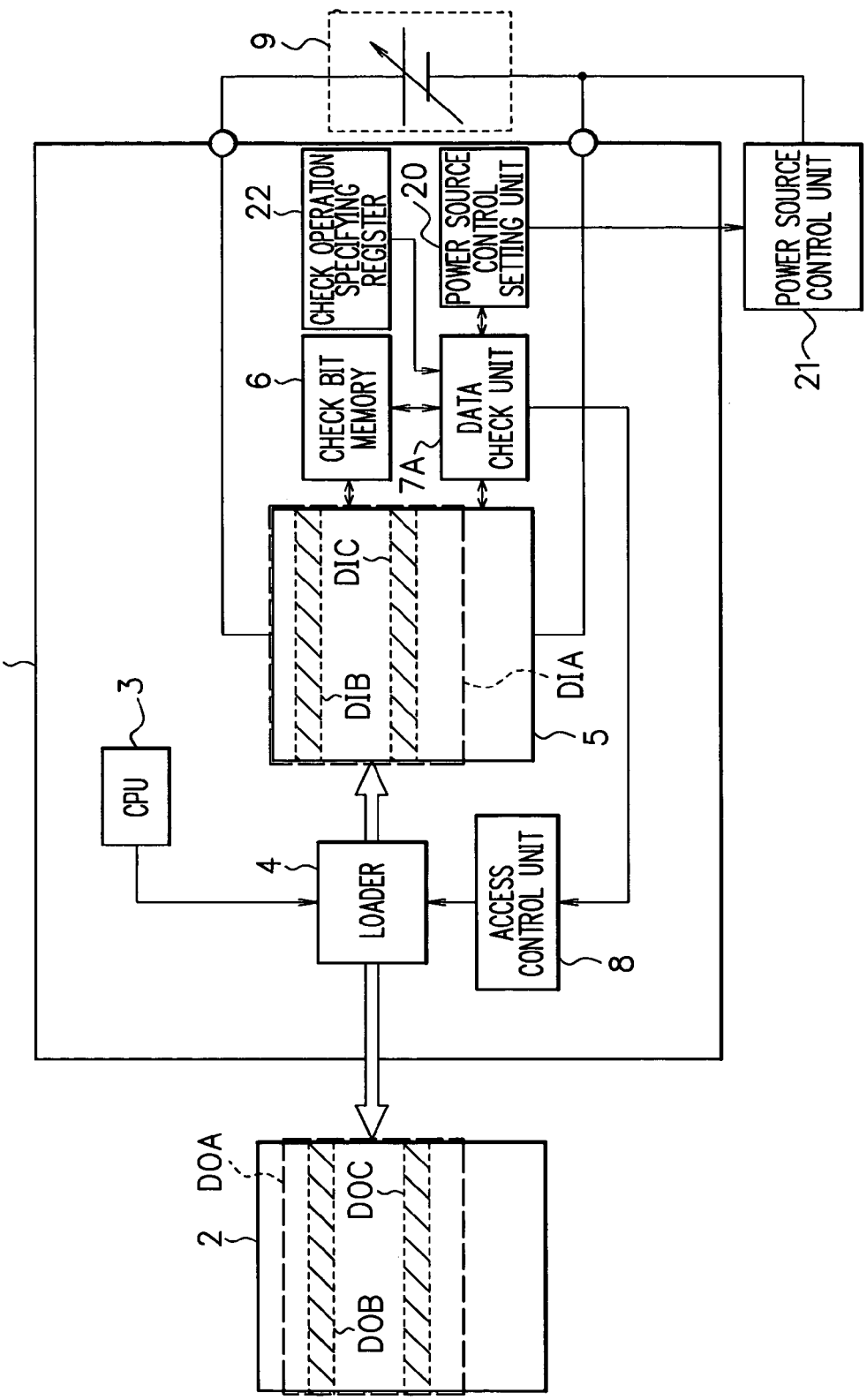
FIG. 8 is a block diagram showing another exemplary configuration of the microcomputer system applied with the semiconductor device according to the third embodiment.
Figure 10:
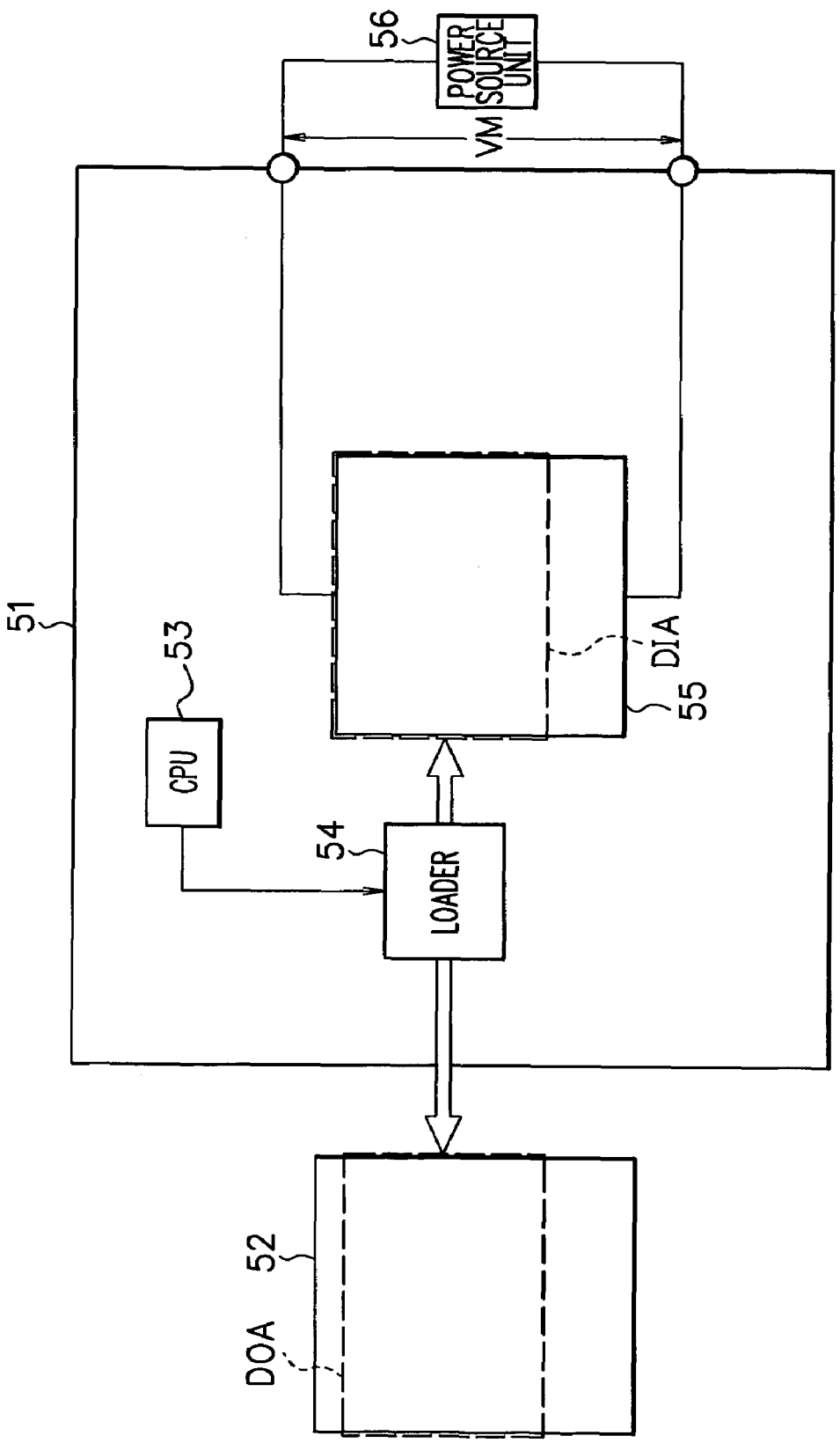
FIG. 10 is a block diagram showing a configuration of a conventional microcomputer system.
Figure 11:
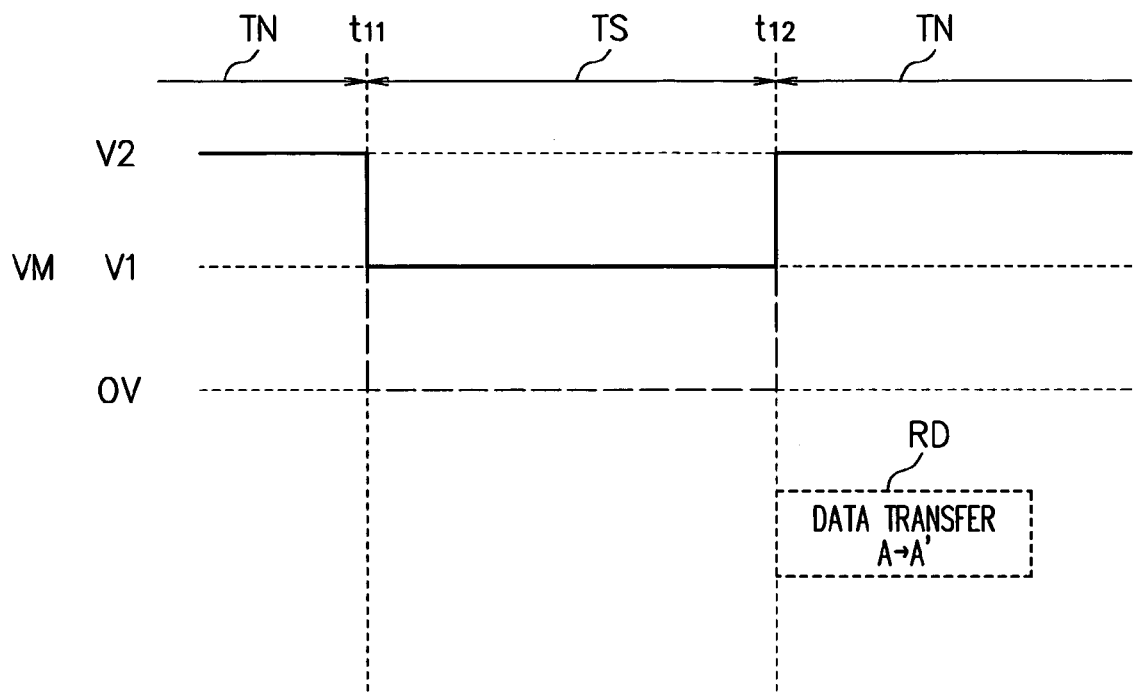
FIG. 11 is a drawing showing operations of the conventional microcomputer system.

For example, as shown in FIG. 8, a check operation specifying register 22, which specifies timing of the data error detection for the entire data area DIA irrespective of whether the data error occurred in the monitor area or not, is provided in the microcomputer 1A, and the data error detection covers the entire data area DIA once in every several times of the transition from the power-save operation to the normal operation, following instructions of the check operation specifying register 22. The check operation specifying register 22 is constantly supplied with the normal operation voltage.

Because the lower limit value of the source voltage capable of guaranteeing the data holding in the internal memory 5 can vary depending on the environment of use (e.g., temperature) as described in the above, the memory voltage setting operation is preferably carried out not only at a point of time immediately after the power-ON, but also at arbitrary points of time during the operation.

For example, the memory voltage setting operation, repeated at predetermined intervals of time after the power-ON makes it possible to occasionally adjust the voltage to be supplied to the internal memory during the power-save operation to an appropriate value adapted to the environment of use and so forth.

For an exemplary case where the lower limit value of the source voltage to be supplied to the internal memory 5 at power-ON is determined, and the data error is found to occur in the internal memory 5 during the operation thereafter, it is also allowable to occasionally re-adjust the voltage to be supplied to the internal memory 5 during the power-save operation to the next higher level. In this case, only an extremely simple processing makes it possible to adjust the voltage to be supplied to the internal memory during the power-save operation to an appropriate value typically adapted to the environment of use.

The check bit memory 6 in the aforementioned individual embodiments is supplied with the normal operation voltage irrespective of its operational modes, wherein the source voltage may be arbitrary so far as it is not lower than the data-holding-guarantee voltage V1, because it is all enough to guarantee the check code held as a data can be guaranteed. For example, it is made possible to further reduce the power consumption, if the source voltage to be supplied to the check bit memory 6 during the power-save operation is adjusted to data-holding-guarantee voltage V1.

The aforementioned individual embodiments were designed so as to carry out the data error detection, and to reload the data from the external memory 2 to the internal memory 5 if the data error was found, whereas it is also allowable to make the data check units 7, 7A carry out error correction, in addition to the data error detection.

For execution of the data error correction, an error detection/correction code typically based on the BCH (Bose-Chaudhuri-Hocquenghem) system or on the RS (Reed-Solomon) system is used as the check code detecting and correcting the data error held in the internal memory 5, and is held in the check bit memory 6. The data check units 7, 7A carry out error detection of the data held in the internal memory 5 based on the check code, and if any error was found, the error is corrected based on the check code. The units are designed so that the data is reloaded from the external memory 2 to the internal memory 5, only when the data error surpasses the error correction ability of the check code. This makes it possible to guarantee not only the data copied from the external memory 2 to the internal memory 5, but also the data variable in the normal operation.

For the case where the internal memory 5 is allocated to the address area of the processor (the internal memory 5 is connected to a bus of the processor, and made accessible), it is also allowable to execute the above-described processes such as those carried out by the loader 4, data check units 7, 7A and access control unit 8, that are detection (and correction) of data error and reloading or erroneous data, under software control by the processor 3 based on a computer program. This is successful in omitting logic circuits and so forth composing the loader 4, data check units 7, 7A and access control unit 8, and in downsizing the circuit scale.

Next paragraphs will describe exemplary operations of a mobile phone applied with the microcomputer system in the aforementioned individual embodiments, referring to FIGS. 9A to 9C. FIGS. 9A to 9C show an intermittent operation of the mobile phone applied with the microcomputer system of the individual embodiments. In FIGS. 9A to 9C, ① stands for memory check (compare codes), ② stands for intermittent receive processing, ③ stands for calculate and save memory check code, and ④ stands for reload memory data.

In FIG. 9A, TN denotes a normal operation period, and TS denotes a power-save operation period allowing operation at a power consumption lower than that in the normal operation.

VM is a source voltage supplied from the power source unit 9 to the internal memory 5, which is supplied at a level of normal operation voltage V2 during the normal operation (period TN), and at a level of voltage V1R during the power-save operation (period TS). The voltage V1R is a voltage value lower than the data-holding-guarantee voltage V1 and higher than 0 V, and is the lower limit value capable of guaranteeing the data held in the internal memory 5, especially for the case where the microcomputer system of the third embodiment is used.

The individual functional units of the microcomputer system is supplied with the normal operation voltage during the normal operation (period TN), whereas the processor 3, loader 4, data check units 7, 7A, and access control unit 8 are disconnected from the power supply during the power-save operation (period TS).

When the mobile phone applied with the microcomputer system of the individual embodiments returns from the power-save operation back to the normal operation, first the data check units 7, 7A in the microcomputer check the internal memory 5 as shown in FIGS. 9B and 9C. In the memory check, the check code is calculated using the data held in the internal memory 5. The data error detection is carried out by comparing thus-calculated check code with the correspondent check code held in the check bit memory 6 (see step S6 in FIG. 3, steps S35, S36 in FIG. 7, etc.).

When the data error detection showed no data error, the processor executes intermittent receiving operations including detection of a base station, location registration and confirmation of incoming call, as shown in FIG. 9B. After completion of the intermittent receiving operations, the data check units 7, 7A uses the data to be written in the internal memory to thereby calculate a check code correspondent to the data, and write the data and check code to the internal memory 5 and check bit memory 6, respectively. If the situation demands, the data held in the internal memory 5 is saved in the external memory 2. After completion of all of these processes, the operational mode transits from the normal operation to the power-save operation.

On the other hand, when the data error correction found data error in the internal memory 5, the loader 4 reloads, as shown in FIG. 9C, the data in the erroneous site from the external memory 2 to the internal memory 5 (see steps S8, S9 in FIG. 3, steps S38 to S40 in FIG. 7, etc.). Thereafter the processor executes intermittent receiving operations including detection of a base station, location registration and confirmation of incoming call, as well as calculation of the check code, writing thereof into the check bit memory 6, and writing of data into the internal memory 5, to thereby allow the operational mode to transit from the normal operation to the power-save operation.

It is to be understood that the above-described embodiments show only a part of specific examples of carrying out the present invention, and by no means limit the technical scope of the present invention. In other words, the present invention can be embodied in various modes, without departing from the technical spirit or essential features thereof.

The check code of the data held in the first memory to be lowered in the source voltage is held in the second memory constantly supplied with a source voltage not lower than the data-holding-guarantee voltage, and error in the data held in the first memory is detected based on the check code. Depending on results of the detection of data error, the data having data error detected therein is reloaded from the storage device to the first memory and copied, or the source voltage to be supplied to the first memory is set during an operation different from the normal operation. This makes it possible to lower the source voltage to be supplied to the first memory to a level lower than the data-holding-guarantee voltage to thereby suppress the leakage current of the first memory, and to detect any error in the data held in the first memory. This consequently makes it possible to reliably guarantee quality of data held in the first memory, and to suppress the power consumption.

What is claimed is:

1. A semiconductor device comprising:
   a first memory copying and holding a data held by a storage device;
   a second memory holding a check code of the data held by said first memory, in each of the blocks obtained by dividing the data by an arbitrary data length, and being supplied with a source voltage not lower than a data-holding-guarantee voltage;
   a data check unit detecting error in the data held by said first memory based on said check code; and
   a reloading unit copying only the data corresponding to the block having a data error detected therein by said data check unit, from said storage device to said first memory,
   wherein, during an arbitrary operation different from a normal operation, said first memory is supplied with a positive source voltage lower than the data-holding-guarantee voltage.

2. The semiconductor device according to claim 1, wherein said check code is preliminarily generated, and is held in said storage device together with the data to be copied to said first memory.

3. The semiconductor device according to claim 1, wherein a first verification code generated and added by block coding of the data held in said first memory is held as said check code in said second memory.

4. The semiconductor device according to claim 3, wherein said first verification code is generated by the block coding based on the CRC system.

5. The semiconductor device according to claim 1, wherein a first verification code generated and added by block coding of the data held in said first memory is held in said first memory, and at the same time, a second verification code generated and added by block coding of said first verification code held in said first memory is held as said check code in said second memory.

6. The semiconductor device according to claim 3, wherein
said data check unit further corrects an error in the data held in said first memory, based on said check code; and
said reloading unit copies only the data corresponding to the block having detected therein data error not correctable by said data check unit, from said storage device to said first memory.

7. The semiconductor device according to claim 6, wherein said first verification code is generated by the block coding based on the BCH system.

8. The semiconductor device according to claim 6, wherein said first verification code is generated by the block coding based on the RS system.

9. The semiconductor device according to claim 1, wherein, in an arbitrary operation different from said normal operation, said second memory is supplied with a source voltage equal to the data-holding-guarantee voltage.

10. The semiconductor device according to claim 1, wherein said first memory is supplied with a positive source voltage lower than the data-holding-guarantee voltage, during a low-power-consumption operation different from said normal operation.

11. The semiconductor device according to claim 1, wherein said check code is an even parity or an odd parity.

12. The semiconductor device according to claim 1, wherein said storage device is a nonvolatile memory, and said first and second memories are volatile memories.

13. A semiconductor device comprising;
a first memory copying and holding a data held by a storage device;
a second memory holding a check code of a data held by said first memory, in each of the blocks obtained by dividing the data by an arbitrary data length, and being supplied with a source voltage not lower than a data-holding-guarantee voltage; and
an operating unit executing data verification processing which detects error in data held in said first memory based on said check code, and reloading processing which copies only the data corresponding to the block having a data error detected therein from said storage device to said first memory, based on a supplied computer program;
wherein, in an arbitrary operation different from a normal operation, said first memory is supplied with a positive source voltage lower than the data-holding-guarantee voltage.

14. A semiconductor device comprising:
a first memory holding a data, and supplied with a positive source voltage lower than a data-holding-guarantee voltage during an arbitrary operation different from a normal operation; and
a second memory holding a check code used for detecting error in the data held in the first memory, and supplied with a source voltage not lower than the data-holding-guarantee voltage.

15. The semiconductor device according to claim 14, wherein said check code of the data, in each of the blocks obtained by dividing the data in said first memory, is held in said second memory.

16. A semiconductor device comprising:
a first memory copying and holding a fixed data held by a storage device;
a second memory holding a check code of the fixed data in each of the blocks obtained by dividing the fixed data by an arbitrary data length, and being supplied with a source voltage not lower than a data-holding-guarantee voltage;
a third memory holding a variable data, different from said first and second memories;
a data check unit detecting error in the fixed data held by said first memory based on said check code; and
a reloading unit copying only the fixed data corresponding to the block having a data error detected therein by said data check unit, from said storage device to said first memory,
wherein, in an arbitrary operation different from a normal operation, the variable data held in said third memory is copied to said storage device, and a positive source voltage lower than the data-holding-guarantee voltage is then supplied to said first and third memories.

17. The semiconductor device according to claim 16, wherein, among the variable data held in said third memory, those having low update frequencies are copied to said storage device.

18. A semiconductor device comprising:
a first memory copying and holding a data held by a storage device;
a second memory holding a check code of the data, and being supplied with a source voltage not lower than a data-holding-guarantee voltage;
a data check unit detecting error in the data held by said first memory based on said check code; and
a voltage setting unit setting a source voltage to be supplied to said first memory in an arbitrary operation different from a normal operation, depending on a result detected by said data check unit; and
an output-voltage-variable power source unit supplying the source voltage to said first memory, depending on the setting by said voltage setting unit.

19. The semiconductor device according to claim 18, wherein said voltage setting unit acquires a lower limit value of voltage allowing said first memory to hold the data, based on the result detected by said data check unit, and sets the acquired lower limit value as a value of the source voltage to be supplied to said first memory in an arbitrary operation different from the normal operation.

20. The semiconductor device according to claim 18, wherein said power source unit step-wisely lowers the value of source voltage to be supplied to said first memory, based on the result detected by said data check unit, to thereby acquire the lower limit value of the voltage allowing said first memory to hold the data.

21. The semiconductor device according to claim 18, wherein said power source unit step-wisely raises the value of source voltage to be supplied to said first memory, based on the result detected by said data check unit, to thereby acquire the lower limit value of the voltage allowing said first memory to hold the data.

22. The semiconductor device according to claim 18, further comprising a reloading unit copying the data having a data error detected therein by said data check unit, from said storage device to said first memory.

23. The semiconductor device according to claim 22, wherein the data check unit judges presence or absence of error in the data held in the first memory, by using a data in a judgment area set in a part of said first memory.

24. The semiconductor device according to claim 18, wherein said power source unit further comprises a power unit supplying a source voltage to said first memory, and a power source control unit controlling said power unit based on a setting made by said voltage setting unit.

25. The semiconductor device according to claim 18, wherein said check code is a check code of every block obtained by dividing the data held in said first memory by an arbitrary data length.

* * * * *